United States Patent
Liu et al.

(10) Patent No.: US 11,293,093 B2
(45) Date of Patent: Apr. 5, 2022

(54) WATER ASSISTED HIGHLY PURE RUTHENIUM THIN FILM DEPOSITION

(71) Applicant: Applied Materials, Inc., Santa Clara, CA (US)

(72) Inventors: Feng Q. Liu, San Jose, CA (US); Feng Chen, San Jose, CA (US); Jeffrey W. Anthis, San Jose, CA (US); David Thompson, San Jose, CA (US); Mei Chang, Saratoga, CA (US)

(73) Assignee: Applied Materials Inc., Santa Clara, CA (US)

( * ) Notice: Subject to any disclaimer, the term of this patent is extended or adjusted under 35 U.S.C. 154(b) by 175 days.

(21) Appl. No.: 15/863,203

(22) Filed: Jan. 5, 2018

(65) Prior Publication Data

US 2018/0195167 A1 Jul. 12, 2018

Related U.S. Application Data

(60) Provisional application No. 62/443,631, filed on Jan. 6, 2017.

(51) Int. Cl.
| | | |
|---|---|---|
| *C23C 16/06* | (2006.01) | |
| *C23C 16/455* | (2006.01) | |
| *C23C 16/18* | (2006.01) | |
| *H01L 21/285* | (2006.01) | |
| *H01L 21/3205* | (2006.01) | |
| *H01L 21/768* | (2006.01) | |

(52) U.S. Cl.
CPC .............. *C23C 16/06* (2013.01); *C23C 16/18* (2013.01); *C23C 16/45527* (2013.01); *C23C 16/45553* (2013.01); *H01L 21/28556* (2013.01); *H01L 21/32051* (2013.01); *H01L 21/76838* (2013.01)

(58) Field of Classification Search
None
See application file for complete search history.

(56) References Cited

U.S. PATENT DOCUMENTS

| | | | |
|---|---|---|---|
| 6,281,125 B1 | 8/2001 | Vaartstra et al. | |
| 7,737,028 B2 | 6/2010 | Wang et al. | |
| 8,927,403 B2 | 1/2015 | Huotari et al. | |
| 2002/0024080 A1* | 2/2002 | Derderian ............... H01L 28/56 | |
| | | | 257/301 |
| 2006/0211228 A1 | 9/2006 | Matsuda | |
| 2007/0259111 A1 | 11/2007 | Singh et al. | |
| 2010/0112215 A1 | 5/2010 | Cuvalci et al. | |
| 2011/0312148 A1 | 12/2011 | Kim et al. | |
| 2013/0146468 A1 | 6/2013 | Kim et al. | |

FOREIGN PATENT DOCUMENTS

| | | |
|---|---|---|
| KR | 20070112190 A | 11/2007 |
| KR | 101628843 B1 | 6/2016 |

OTHER PUBLICATIONS

PCT International Search Report and Written Opinion in PCT/US2018/012557 dated Apr. 13, 2018, 13 pages.

* cited by examiner

*Primary Examiner* — Joel G Horning
(74) *Attorney, Agent, or Firm* — Servilla Whitney LLC

(57) ABSTRACT

Processing methods comprising exposing a substrate to a first reactive gas comprising an ethylcyclopentadienyl ruthenium complex or a cyclohexadienyl ruthenium complex and a second reactive gas comprising water to form a ruthenium film are described.

15 Claims, No Drawings

WATER ASSISTED HIGHLY PURE RUTHENIUM THIN FILM DEPOSITION

CROSS-REFERENCE TO RELATED APPLICATIONS

This application claims priority to U.S. Provisional Application No. 62/443,631, filed Jan. 6, 2017, the entire disclosure of which is hereby incorporated by reference herein.

FIELD

Embodiments of the disclosure relate to ruthenium thin film deposition. More particularly, embodiments of the disclosure are directed to the deposition of ruthenium thin films using water as an oxidant.

BACKGROUND

Ruthenium and ruthenium based thin films have attractive material and conductive properties. These films have been proposed and tested for applications from front end to back end parts of semiconductor and microelectronic devices. Ruthenium thin film deposition has been studied for many years by both academic and industry researchers. There are some precursors of Ru that have been used for Ru thin film processes, such as $Ru_3(CO)_9$, bis(ethylcyclopentadienyl) ruthenium and derivatives thereof. Reactants used for those processes can be $H_2$, $O_2$ or $O_3$. Bis(ethylcyclopentadienyl) ruthenium and its derivatives show ALD process characteristics. However, the precursor gives thin film with more than 40% carbon, leading to a film with a high resistivity.

Using $O_2$ or $O_3$ can generate carbon-less ruthenium films with better film conductivity. However, $O_2$ or $O_3$ use can also oxidize underneath layers easily (e.g., barrier layer) causing barrier layer failure. Additionally, $O_2$ and $O_3$ can result in the formation of ruthenium oxide.

Cyclohexadienyl ruthenium tricarbonyl, $Ru_3(CO)_9$ and derivatives thereof are versatile precursors for CVD application for ruthenium thin films as a seed layer or conductive layer. However, the films always contain some percent impurity, such as C, 3-8% which affects conductivity.

Therefore, there is a need in the art for methods of depositing ruthenium thin films with good conductivity and/or lower impurity levels.

SUMMARY

One or more embodiments of the disclosure are directed processing methods comprising exposing a substrate to a first reactive gas comprising an ethylcyclopentadienyl ruthenium complex or a cyclohexadienyl ruthenium complex and a second reactive gas comprising water to form a ruthenium film.

Additional embodiments of the disclosure are directed to processing methods comprising sequentially exposing a substrate to a first reactive gas comprising bis(ethylcyclopentadienyl)ruthenium and a second reactive gas consisting essentially of water to form a ruthenium film.

Further embodiments of the disclosure are directed to processing methods comprising sequentially exposing a substrate to a first reactive gas comprising cyclohexadienyl ruthenium tricarbonyl and a second reactive gas consisting essentially of water to form a ruthenium film.

DETAILED DESCRIPTION

Embodiments of the disclosure provide precursors and processes for depositing ruthenium-containing films. The process of various embodiments uses vapor deposition techniques, such as an atomic layer deposition (ALD) or chemical vapor deposition (CVD) to provide ruthenium films.

A "substrate surface", as used herein, refers to any portion of a substrate or portion of a material surface formed on a substrate upon which film processing is performed. For example, a substrate surface on which processing can be performed include materials such as silicon, silicon oxide, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present invention, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. Substrates may have various dimensions, such as 200 mm or 300 mm diameter wafers, as well as, rectangular or square panes. In some embodiments, the substrate comprises a rigid discrete material.

"Atomic layer deposition" or "cyclical deposition" as used herein refers to the sequential exposure of two or more reactive compounds to deposit a layer of material on a substrate surface. As used in this specification and the appended claims, the terms "reactive compound", "reactive gas", "reactive species", "precursor", "process gas" and the like are used interchangeably to mean a substance with a species capable of reacting with the substrate surface or material on the substrate surface in a surface reaction (e.g., chemisorption, oxidation, reduction). The substrate, or portion of the substrate is exposed sequentially to the two or more reactive compounds which are introduced into a reaction zone of a processing chamber. In a time-domain ALD process, exposure to each reactive compound is separated by a time delay to allow each compound to adhere and/or react on the substrate surface. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay a purge gas, such as argon, is introduced into the processing chamber to purge the reaction zone or otherwise remove any residual reactive compound or by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the desired thickness.

In an aspect of a spatial ALD process, a first reactive gas and second reactive gas are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

Embodiments of the disclosure advantageously provide methods to use water moisture to achieve ALD process with bis(ethylcyclopentadienyl)ruthenium with water with low Ru film resistivity. Some embodiments of the disclosure produce ruthenium films higher purity than with other ruthenium precursors.

In some embodiments, deposition of ruthenium films using sequential exposure of bis(ethylcyclopentadienyl)ruthenium and water vapor can remove hydrocarbon from ruthenium to generate purer Ru films.

In some embodiments, the ruthenium precursor pulse length and number of pulses can be varied to achieve thicker Ru layers to react with water sequentially. Some embodiments increase process throughput with purer Ru film.

Some embodiments advantageously use water as a co-reactant to improve the ruthenium film deposition rate and conductivity. One or more embodiments of the disclosure advantageously provide integration schemes to deposit Ru films to eliminate seams issues during gap-fill.

One or more embodiment of the disclosure is directed to a processing method for forming a ruthenium film. The processing method comprises exposing a substrate or substrate surface to a first reactive gas comprising a ruthenium complex and a second reactive gas comprising water.

The ruthenium complex of some embodiments comprises an ethylcyclopentadienyl ruthenium complex or a cyclohexadienyl ruthenium complex. In some embodiments, the ethylcyclopentadienyl ruthenium complex is bis(ethylcyclopentadienyl)ruthenium. In some embodiments, the first reactive gas consists essentially of bis(ethylcyclopentadienyl) ruthenium. As used in this manner, the term "consists essentially of" means the ruthenium-containing precursor is greater than or equal to about 95%, 98% or 99% of the stated species on a molecular basis. In some embodiments, the ethylcyclopentadienyl ruthenium complex comprises one or more carbonyl ligands. In some embodiments, the ethylcyclopentadienyl ruthenium complex comprises or consists essentially of ethylcyclopentadienyl ruthenium dicarbonyl. In some embodiments, the ethylcyclopentadienyl ruthenium complex comprises or consists essentially of ethylcyclopentadienyl ruthenium tricarbonyl.

In some embodiments, the cyclohexadienyl ruthenium complex is a cyclohexadienyl ruthenium carbonyl complex. In some embodiments, the cyclohexadienyl ruthenium complex is a cyclohexadienyl ruthenium tricarbonyl. In some embodiments, the first reactive gas consists essentially of cyclohexadienyl ruthenium tricarbonyl. As used in this manner, the term "consists essentially of" means the ruthenium-containing precursor is greater than or equal to about 95%, 98% or 99% of the stated species on a molecular basis. In some embodiments, the cyclohexadienyl ruthenium complex is a methylcyclohexadienyl ruthenium tricarbonyl. In some embodiments, the first reactive gas consists essentially of methylcyclohexadienyl ruthenium tricarbonyl. In some embodiments, the cyclohexadienyl group includes one or more methyl, ethyl, propyl or butyl groups on the cyclohexadiene ring.

In some embodiments, the ruthenium film is formed by a CVD process where the first reactive gas and the second reactive gas are exposed to the substrate at the same time in a mixture. In some embodiments, the ruthenium film is formed by an ALD process where the first reactive gas and the second reactive gas are exposed to the substrate sequentially.

The second reactive gas of some embodiments comprises water (e.g., water vapor). In some embodiments, the second reactive gas consists essentially of water. As used in this regard the term "consists essentially of water" means that the reactive species of the second reactive gas is greater than or equal to about 95%, 98% or 99% water on a molecular basis. Diluent and inert gases are not included in the reactive gas calculation for either the first reactive gas or the second reactive gas.

In some embodiments, the second reactive gas comprises substantially no $H_2$. As used in this regard, the term "substantially no" means that the reactive species of the second reactive gas is less than or equal to about 5%, 4%, 3%, 2% or 1%) of the stated species. In some embodiments, the second reactive gas comprises substantially no $O_2$.

In some embodiments, the second reactive gas includes a stronger oxidizing agent than water to form an intermediate strength oxidizer. As used in this manner, intermediate strength means an oxidizing strength between pure $O_3$ and pure water. In some embodiments, the second reactive gas further comprises one or more of $O_2$, alcohol or ammonia. When the second reactive gas is an intermediate strength oxidizer, the second reactive gas comprises greater than or equal to about 70% water on a molecular basis. In some embodiments, the second reactive gas comprises greater than or equal to about 50%, 60%, 80%, 90% or 95% water on a molecular basis.

The temperature of the substrate during deposition can be controlled, for example, by setting the temperature of the substrate support or susceptor. In some embodiments the substrate is held at a temperature in the range of about 200° C. to about 400° C., or in the range of about 200° C. to about 300° C., or in the range of about 250° C. to about 350° C., or in the range of about 250° C. to about 300° C.

In addition to the foregoing, additional process parameters may be regulated while exposing the substrate to the ruthenium-containing process gas and/or the second reactive gas. For example, in some embodiments, the process chamber may be maintained at a pressure of about 0.1 to about 50 Torr, or in the range of about 1 Torr to about 20 Torr, or in the range of about 2 Torr to about 5 Torr, or in the range of about 1.8 Torr to about 2.5 Torr.

The ruthenium film formed by one or more embodiments of the disclosure has a resistivity less than or equal to about 40 µΩ-cm, 35 µΩ-cm, 30 µΩ-cm or 15 µΩ-cm.

In some embodiments, the ruthenium film has a growth rate greater than or equal to about 0.6 Å/cycle, 1 Å/cycle, 2 Å/cycle or 3 Å/cycle, where a cycle comprises a sequential exposure to the first reactive gas and the second reactive gas. In one or more embodiments, the growth rate of the ruthenium film is greater than or equal to about 0.6 Å/cycle or 4 Å/cycle.

In some embodiments, the ruthenium-containing film comprises greater than or equal to about 95 atomic percent ruthenium. In some embodiments, the ruthenium-containing film comprises greater than or equal to about 96, 97, 98, 99 or 99.5% ruthenium on an atomic basis. In one or more embodiments, the sum of C, N, O and halogen atoms is less than or equal to about 5, 4, 3, 2, 2 or 1 atomic percent of the ruthenium-containing film. In some embodiments, the ruthenium film has a carbon content less than or equal to about 3%, 2%, 1% or 0.5% on an atomic basis. In some embodiments, the oxygen content of the ruthenium-containing film is less than or equal to about 5, 4, 3, 2, 1 or 0.5 atomic percent.

EXAMPLES

Ruthenium films were deposited on cobalt, tantalum nitride, silicon oxide and copper surfaces at 320° C. and 290° C. The ruthenium precursor was bis(ethylcyclopentadienyl)ruthenium and the reactant was water. The ruthenium precursor was exposed to the substrate for about 3 seconds, the chamber was purged for about 2 seconds, the water was exposed to the substrate for about 5 seconds and the chamber was purged for about 8 seconds. This cycle was repeated 200 times at a chamber pressure of about 0.8 torr. The thickness of the film as a function of the substrate surface and temperature is collected in Table 1. The resistivity of the film on a silicon oxide surface is listed in Table 2. The values listed in the Tables are good faith approximations from graphical data.

TABLE 1

| | Thickness, Å | |
|---|---|---|
| Substrate | 290° C. | 320° C. |
| Co | 60 | 135 |
| TaN | 110 | 195 |
| SiO$_2$ | 170 | 195 |
| Cu | 40 | 125 |

TABLE 2

| Temperature, ° C. | Resistivity, µΩ-cm |
|---|---|
| 290 | 23 |
| 320 | 13 |

Ruthenium films were deposited at 225° C. using 60 cycles of sequential exposures of methylcyclohexadienyl ruthenium tricarbonyl and different reactants. A thermal decomposition, O$_2$, alcohol and water were used as the reactant. The substrates were cobalt, tantalum nitride, silicon oxide and copper. The chamber pressure was about 2 torr. The deposition rate as a function of the reactant is collected in Table 3 and the film resistivity as a function of the reactant is listed in Table 4.

TABLE 3

| | Deposition Rate, Å/cycle | | | |
|---|---|---|---|---|
| Reactant | Co | TaN | SiO$_2$ | Cu |
| Thermal | 2.5 | 2.0 | 2.5 | 2.5 |
| O$_2$ | 4.8 | 4.5 | 4.8 | 4.5 |
| Alcohol | 4.7 | 3.5 | 3.8 | 4.2 |
| Water | 4.2 | 4.1 | 4.5 | 3.1 |

TABLE 4

| | Resistivity, µΩ-cm | |
|---|---|---|
| Reactant | TaN | SiO$_2$ |
| Thermal | 130 | 144 |
| O$_2$ | 29 | 31 |
| Alcohol | 105 | 115 |
| Water | 22 | 24 |

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method for depositing a ruthenium film by an atomic layer deposition method, the method consisting essentially of:
exposing a substrate sequentially to a first reactive gas consisting essentially of an ethylcyclopentadienyl ruthenium complex or a cyclohexadienyl ruthenium complex and an oxidizing second reactive gas, the second reactive gas consists substantially no H$_2$; and
repeating sequential exposures to the first reactive gas and the second reactive gases to form a ruthenium film having greater than or equal to about 95 atomic percent ruthenium, a carbon content less than or equal to about 3% on an atomic basis, a sum of carbon, nitrogen, oxygen and halogen atoms less than or equal to about 5% on an atomic basis, and a resistivity less than or equal to about 40 µΩ-cm,
wherein the second reactive gas comprising greater than or equal to about 95% water.

2. The processing method of claim 1, wherein the first reactive gas consists essentially of cyclohexadienyl ruthenium tricarbonyl.

3. The processing method of claim 1, wherein the second reactive gas comprises less than or equal to about 5% O$_2$ on a molecular basis.

4. The processing method of claim 1, wherein the second reactive gas further comprises a total of less than or equal to about 5% of one or more of O$_2$, alcohol or ammonia on a molecular basis.

5. The processing method of claim 1, wherein the substrate is maintained at a temperature in the range of about 200° C. to about 400° C.

6. The processing method of claim 1, wherein the pressure of the first reactive gas and the second reactive gas are each in the range of about 0.1 Torr to about 50 Torr.

7. The processing method of claim 6, wherein the pressure of the first reactive gas and the second reactive gas are each in the range of about 2 Torr to about 5 Torr.

8. The processing method of claim 1, wherein the ruthenium film has a resistivity less than or equal to about 30 µΩ-cm.

9. The processing method of claim 1, wherein the ruthenium film has a growth rate of about 0.6 to about 4.0 Å/cycle.

10. A method for depositing a ruthenium film by an atomic layer deposition method, the method consisting essentially of sequentially exposing a substrate to a first reactive gas consisting essentially of bis(ethylcyclopentadienyl)ruthenium and an oxidizing second reactive gas to form a ruthenium film, the second reactive gas consists substantially no $H_2$; and repeating sequential exposures to the first reactive gas and the second reactive gases to form a ruthenium film having greater than or equal to about 95 atomic percent ruthenium, a carbon content less than or equal to about 3% on an atomic basis, a sum of carbon, nitrogen, oxygen and halogen atoms less than or equal to about 5% on an atomic basis, and a resistivity less than or equal to about 40 $\mu\Omega$-cm, wherein the second reactive gas comprising greater than or equal to about 95% water.

11. The processing method of claim 10, wherein the substrate is maintained at a temperature in the range of about 200° C. to about 400° C. and the pressure of the first reactive gas and the second reactive gas are each in the range of about 0.1 Torr to about 50 Torr.

12. The processing method of claim 10, wherein the ruthenium film has a resistivity less than or equal to about 30 $\mu\Omega$-cm and a growth rate of about 0.6 to about 4.0 Å/cycle.

13. A method for depositing a ruthenium film by an atomic layer deposition method, the method consisting essentially of sequentially exposing a substrate to a first reactive gas consisting essentially of cyclohexadienyl ruthenium tricarbonyl and an oxidizing second reactive gas to form a ruthenium film, the second reactive gas consists substantially no $H_2$, and repeating exposure to the first and second reactive gases to form a ruthenium film comprising greater than or equal to about 98% ruthenium on an atomic basis and a sum of carbon, oxygen, nitrogen and halogen atoms less than or equal to about 2% on an atomic basis, and a resistivity less than or equal to about 40 $\mu\Omega$-cm, wherein the second reactive gas comprising greater than or equal to about 95% water.

14. The processing method of claim 13, wherein the substrate is maintained at a temperature in the range of about 200° C. to about 400° C. and the pressure of the first reactive gas and the second reactive gas are each in the range of about 0.1 Torr to about 50 Torr.

15. The processing method of claim 13, wherein the ruthenium film has a resistivity less than or equal to about 30 $\mu\Omega$-cm and a growth rate of about 0.6 to about 4.0 Å/cycle.

\* \* \* \* \*